(12) United States Patent
Murfitt et al.

(10) Patent No.: US 11,542,932 B2
(45) Date of Patent: Jan. 3, 2023

(54) VACUUM SYSTEM PIPE COUPLINGS

(71) Applicant: Edwards Limited, Burgess Hill (GB)

(72) Inventors: Anthony Marcus Murfitt, Burgess Hill (GB); James Baden Ireson, Burgess Hill (GB); Hammond Deo, Burgess Hill (GB)

(73) Assignee: Edwards Limited, Burgess Hill (GB)

( * ) Notice: Subject to any disclaimer, the term of this patent is extended or adjusted under 35 U.S.C. 154(b) by 338 days.

(21) Appl. No.: 16/763,516

(22) PCT Filed: Nov. 8, 2018

(86) PCT No.: PCT/GB2018/053242
§ 371 (c)(1),
(2) Date: May 12, 2020

(87) PCT Pub. No.: WO2019/092428
PCT Pub. Date: May 16, 2019

(65) Prior Publication Data
US 2020/0340605 A1    Oct. 29, 2020

(30) Foreign Application Priority Data

Nov. 13, 2017  (GB) ..................................... 1718752
Dec. 21, 2017  (GB) ..................................... 1721640

(51) Int. Cl.
*F16L 53/35*     (2018.01)
*F04B 37/14*     (2006.01)
(Continued)

(52) U.S. Cl.
CPC ............ *F04B 37/14* (2013.01); *F04B 39/121* (2013.01); *F04B 39/123* (2013.01); *F04B 39/14* (2013.01);
(Continued)

(58) Field of Classification Search
CPC . F16L 23/08; F16L 43/00; F16L 51/04; F16L 53/35; F16L 53/38
(Continued)

(56) References Cited

U.S. PATENT DOCUMENTS 1,985,544 A * 12/1934 Muchnic ................. F16L 43/00
                                                    285/411
3,398,262 A *  8/1968 Kahn ....................... H05B 3/00
                                                    219/535
(Continued)

FOREIGN PATENT DOCUMENTS

CN       1431421 A    7/2003
CN       1989345 A    6/2007
(Continued)

OTHER PUBLICATIONS

Machine translation DE 8811176.*
(Continued)

*Primary Examiner* — Kevin F Murphy
(74) *Attorney, Agent, or Firm* — Shumaker & Sieffert, P.A.

(57) ABSTRACT

A vacuum system pipe coupling includes a first coupling member defining a through passage, a second coupling member defining a through passage and a securing unit. The first coupling member has a first end portion having a first lengthways extending axis, a second end portion having a second lengthways extending axis that is laterally offset with respect to the first lengthways extending axis and a first connecting portion connecting the first and second end portions. The second coupling member has a third end portion having a third lengthways extending axis, a fourth end portion having a fourth lengthways extending axis that is laterally offset with respect to the third lengthways extending axis and a second connecting portion connecting the third and fourth end portions. The securing unit is configured (Continued)

to secure the first end portion to the third end portion with the first and third lengthways extending axes in alignment.

9 Claims, 5 Drawing Sheets

(51) Int. Cl.
| | |
|---|---|
| *F04B 39/12* | (2006.01) |
| *F04B 39/14* | (2006.01) |
| *F04C 25/02* | (2006.01) |
| *F04B 41/00* | (2006.01) |
| *F16L 51/04* | (2006.01) |
| *F04C 23/00* | (2006.01) |
| *F16L 23/08* | (2006.01) |
| *C23C 16/44* | (2006.01) |

(52) U.S. Cl.
CPC .............. *F04B 41/00* (2013.01); *F04C 23/00* (2013.01); *F04C 25/02* (2013.01); *F16L 23/08* (2013.01); *F16L 51/04* (2013.01); *F16L 53/35* (2018.01); *C23C 16/4412* (2013.01); *F04C 2240/30* (2013.01); *F04C 2240/70* (2013.01); *F04C 2240/81* (2013.01)

(58) Field of Classification Search
USPC ......................................................... 138/155
See application file for complete search history.

(56) References Cited

U.S. PATENT DOCUMENTS

| | | | | |
|---|---|---|---|---|
| 4,031,611 | A * | 6/1977 | Johnson, Jr. ............ | F16L 59/18 285/55 |
| 4,163,571 | A * | 8/1979 | Nash ....................... | F16L 47/14 285/112 |
| 4,214,628 | A * | 7/1980 | Botts ........................ | E21B 43/20 166/90.1 |
| 4,553,023 | A * | 11/1985 | Jameson ................. | F16L 53/38 137/341 |
| 5,415,439 | A * | 5/1995 | Wells ...................... | F16L 23/10 285/332.1 |
| 5,769,467 | A | 6/1998 | Bridges | |
| 6,382,266 | B1 * | 5/2002 | Bus ...................... | G01M 3/2892 141/285 |
| 7,190,892 | B2 * | 3/2007 | Kertesz .................. | F16L 53/38 392/468 |
| 7,350,823 | B2 * | 4/2008 | Ichimura .............. | B21D 41/021 285/123.3 |
| 9,719,623 | B2 * | 8/2017 | Chakkalakal ........... | F16L 53/30 |
| 2015/0308601 | A1 | 10/2015 | Lee | |

FOREIGN PATENT DOCUMENTS

| | | |
|---|---|---|
| CN | 106090503 A | 11/2016 |
| CN | 206018075 | 3/2017 |
| DE | 219659 C | 3/1920 |
| DE | 8811176 U1 * | 2/1989 |
| DE | 202015005199 | 9/2015 |
| EP | 2815800 A3 | 12/2014 |
| GB | 2481793 | 1/2012 |
| JP | S4720717 A | 9/1972 |
| JP | S5015116 A | 2/1975 |
| JP | 2008234939 A | 10/2008 |
| JP | 2013020646 A | 1/2013 |
| JP | 2014231822 A | 12/2014 |
| TW | 200737289 A | 10/2007 |
| WO | 2006008521 A1 | 1/2006 |

OTHER PUBLICATIONS

Combined Search and Examination Report under Sections 17 and 18(3) dated Jun. 18, 2018 in counterpart GB application No. 1721640.9, 5 pp.

International Search Report and Written Opinion dated Jan. 3, 2019 received in counterpart International Application No. PCT/GB2018/053242, 11 pp.

Office Action, and translation thereof, from counterpart Taiwanese Application No. 107140191 dated Jul. 14, 2022, 24 pp.

Office Action from counterpart Japanese Application No. 2020-544173 dated Oct. 17, 2022, 14 pp.

* cited by examiner

VACUUM SYSTEM PIPE COUPLINGS

This application is a national stage entry under 35 U.S.C. § 371 of International Application No. PCT/GB2018/053242, filed Nov. 8, 2018, which claims the benefit of GB Application 1721640.9, filed Dec. 21, 2017; and GB Application 1718752.7, filed Nov. 13, 2017. The entire contents of International Application No. PCT/GB2018/053242; GB Application 1721640.9; and GB Application 1718752.7 are incorporated herein by reference.

TECHNICAL FIELD

The disclosure relates to vacuum system pipe couplings.

BACKGROUND

Vacuum systems may comprise one or more pumping units, one or more abatement units, cooling systems and purge gas supply systems that are connected with one another by a system of pipes. A pumping unit in such a vacuum system will at least be coupled to an inlet pipe via which a gas or vapour that is to be pumped is channelled into a pump inlet and an exhaust pipe via which pumped gas or vapour is channelled away from the pumping unit to atmosphere, or to an abatement unit for cleaning prior to discharge to atmosphere.

In many examples, when a vacuum system is assembled, some of the pipes will not aligned so that rigid inline vacuum system pipe couplings cannot be used. It is known to get around this problem by using a metal bellows to connect non-aligned pipes. A bellows can be axially stretched or compressed to compensate for variations in the distance between the respective ends of two pipes. Also, if the ends of the pipes are not aligned, a bellows can deform laterally to compensate for the non-alignment.

The use of bellows to compensate for a lack of alignment between the ends of two pipes is not without problems. Although a bellows can deform laterally to compensate for the non-alignment of pipes, the degree of lateral deformation obtainable with a metal bellows is relatively limited. Furthermore, lateral deformation of a bellows stresses the bellows and may cause one or both of the flanges at the end of the bellows to twist so that the respective joints made with the ends of the two pipes that are being coupled may be compromised. The stressing of a bellows by lateral deformation may also make the bellows more prone to failure, particularly if the bellows is subjected to vibration.

A further problem with bellows is that debris may collect in the corrugations making a pipe coupling made with bellows prone to blockage. Still another problem with bellows is that the corrugations may collect moisture if the gases or vapours transported through the coupling condense. It is known to use pipe heaters to heat piping in vacuum systems to prevent, or at least reduce, condensation of the gases or vapours transported through the pipes. A pipe heater may comprise a flexible substrate carrying one or more electric resistance heating elements and buckles or the like by which the heater can be secured in position wrapped around a pipe. Such pipe heaters are not particularly effective when used on bellows. This is because the pipe heater can only engage the relatively limited surface area provided by the peaks of the corrugations. This limits heat conduction into the bellows and may result in cold spots in areas not contacted by the pipe heater. The result is that gases and vapours may condense on the relatively colder surface portions of the bellows, whose corrugations provide a trap for the condensed liquid.

SUMMARY

The disclosure provides a vacuum system pipe coupling as specified in claim 1.

The disclosure also includes a method of manufacturing a vacuum system pipe coupling as specified in claim 1.

The disclosure also includes a vacuum system as specified in claim 9 or claim 10.

The disclosure also includes a method of coupling respective ends of a first pipe and a second pipe in a vacuum system as specified in claim 14.

BRIEF DESCRIPTION OF DRAWINGS

In the following disclosure, reference will be made to the drawings.

DETAILED DESCRIPTION

Figure 1:
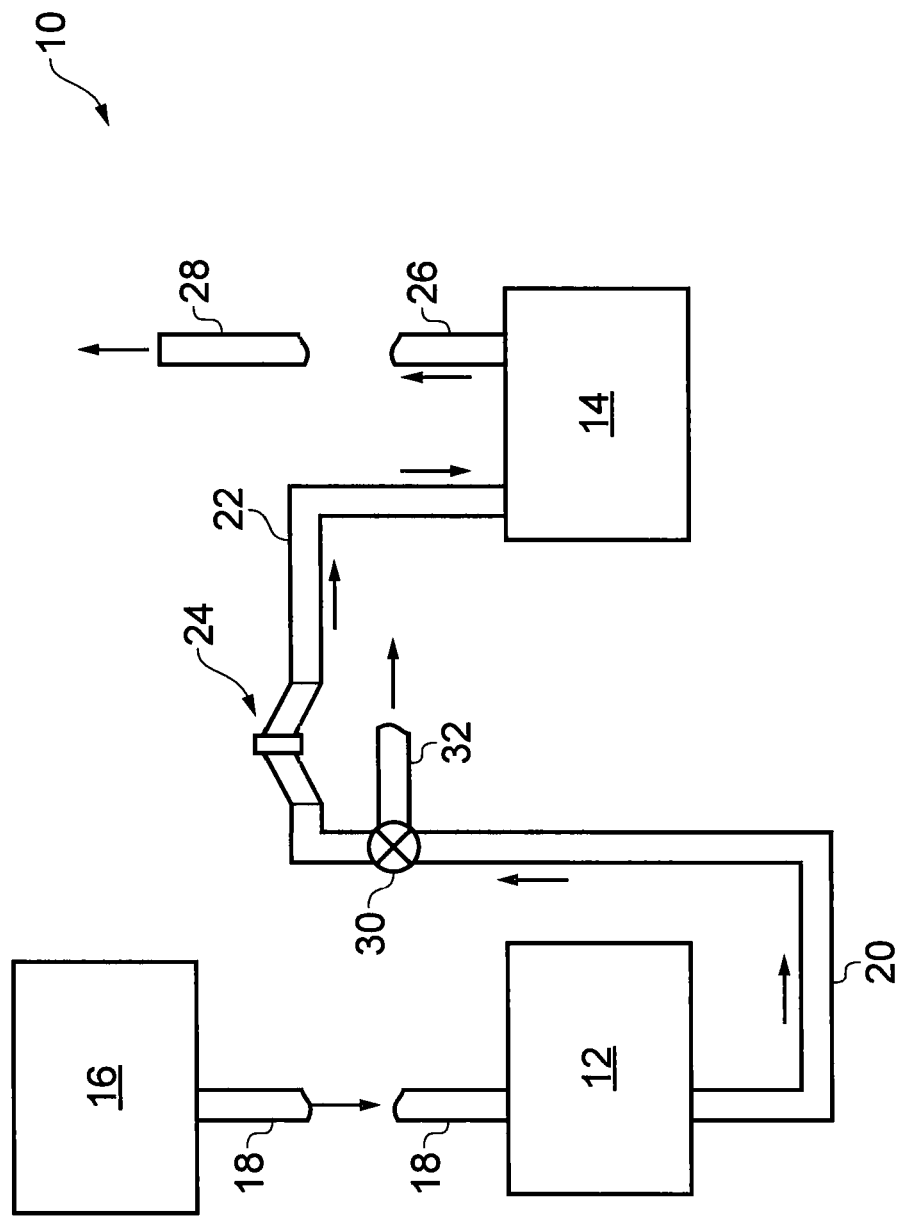
FIG. 1 is a schematic representation of a vacuum system.

Referring to FIG. 1, a vacuum system 10 comprises a pumping unit 12 and an abatement unit 14. The pumping unit 12, which may comprise one or more vacuum pumps, may be connected with processing equipment 16 via an inlet line 18. Filters, valves and the like may be provided in the inlet line 18 between the processing equipment 16 and pumping unit 12 as required. An exhaust line 20 extends from the pumping unit 12. The exhaust line 20 is coupled to an inlet line 22 of the abatement unit 14 by a vacuum system pipe coupling 24. An exhaust line 26 extends from the abatement unit 14 and is coupled to a discharge line 28 through which gases cleaned by the abatement unit 14 are channelled away from the vacuum system 10. A diverter valve 30 may be provided in the exhaust line 20 to allow gases flowing in the exhaust line that do not need cleaning to be diverted into a bypass line 32 that leads to the discharge line 28, bypassing the abatement unit 14.

Figure 2:
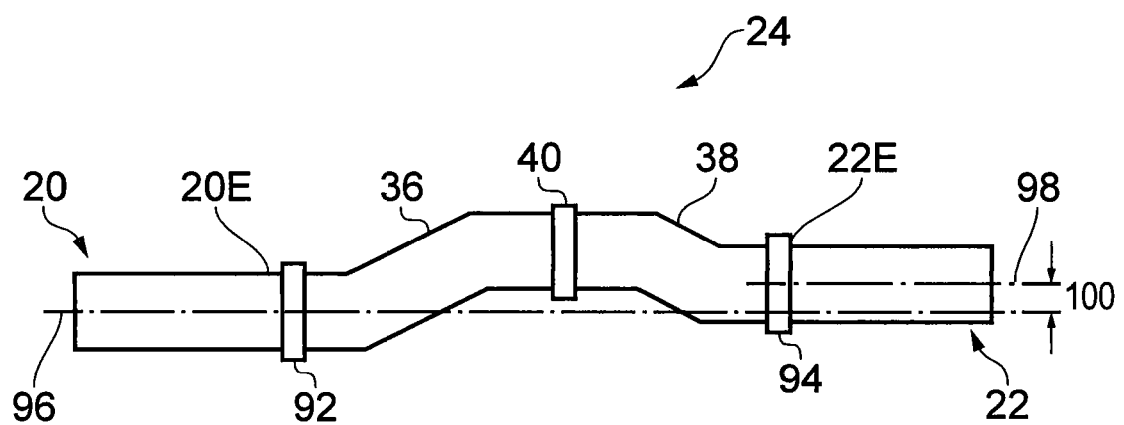
FIG. 2 is an enlarged schematic representation of a vacuum system pipe coupling of the vacuum system of FIG. 1.
Figure 3:
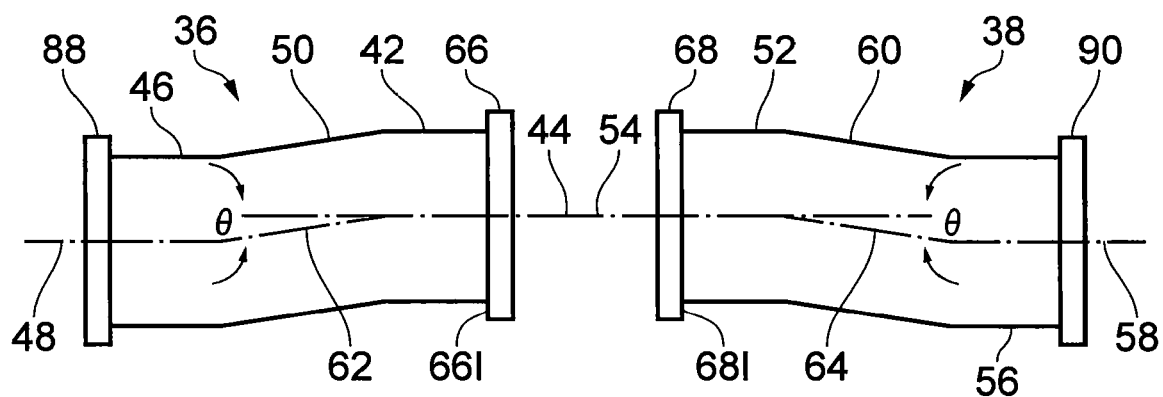
FIG. 3 is a schematic representation of two pipe members of the vacuum system pipe coupling of FIG. 2.

Referring to FIGS. 2 and 3, the vacuum system pipe coupling 24 comprises a first coupling member 36, a second coupling member 38 and a securing device 40 to secure the first coupling member to the second coupling member. Each of the coupling members 36, 38 defines a through passage through which, in use, a gas or vapour may flow between two pipe sections that are connected by the vacuum system pipe coupling.

As best seen in FIG. 3, the first coupling member 36 has a first end portion 42 having a first lengthways extending axis 44, a second end portion 46 having a second lengthways extending axis 48 that is offset with respect to the first lengthways extending axis and a first connecting portion 50 connecting the first end portion to the second end portion. The first and second portions 44, 46 and connecting portion 50 may be at least in part defined by a pipe member that may comprise a plurality of pipe sections welded to one another in series or a single length of piping. Similarly, the second coupling member 38 has a third end portion 52 having a third lengthways extending axis 54, a fourth end portion 56 having a fourth lengthways extending axis 58 that is offset with respect to the third lengthways extending axis and a second connecting portion 60 connecting the third end portion to the fourth end portion. The third and fourth end portions 52, 56 and connecting portion 60 may be at least in part defined by a pipe member that may comprise a plurality of pipe sections welded to one another in series or a single length of piping. Although not essential, as illustrated in FIG. 3, the first and second coupling members 36, 38 may be of at least substantially identical construction.

As best seen in FIG. 3, the connecting portion 50 has a fifth lengthways extending axis 62, which extends transverse to the first and second lengthways extending axes 44, 48. Similarly, the connecting portion 60 has a sixth lengthways extending axis 64 that extends transverse to the third and fourth lengthways extending axes 54, 58. The first and second lengthways extending axes 44, 48 may extend in parallel and the fifth lengthways extending axis 62 may extend at an angle of between 1 and 45° to the first and second lengthways extending axes. Similarly, the third and fourth lengthways extending axes 54, 58 may extend in parallel and the sixth lengthways extending axis 64 may extend at an angle of between 5 and 45° to the third and fourth lengthways extending axes.

Figure 4:
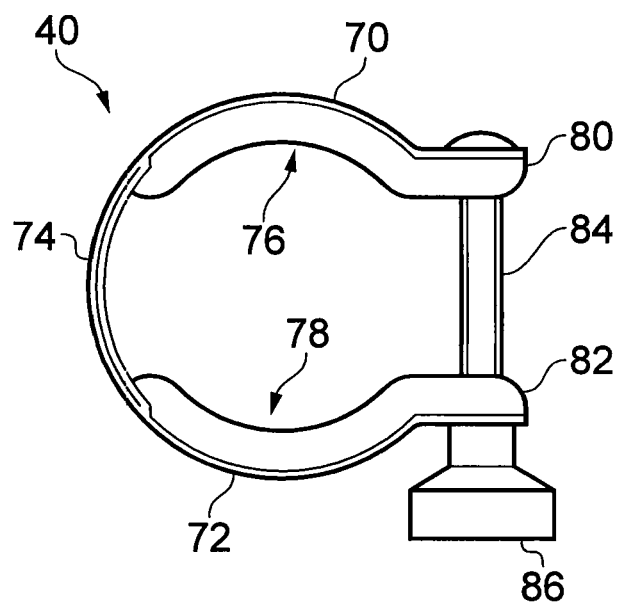
FIG. 4 is a plan view of a securing unit of the vacuum system pipe coupling of FIG. 2.

The securing unit 40 may comprise any suitable known securing unit operable to releasably secure the ends of two pipe members of a vacuum pipeline to one another. As shown in the illustrated example, the first and third end portions 42, 52 may further comprise respective flanges 66, 68. The securing unit 40 may comprise any known clamp mechanism suitable to clamp the two flanges 66, 68 together in face to face relationship. The securing unit 40 may, for example, comprise the Edwards KF (NW) 50 stainless steel clamping mechanism 50 as shown in FIG. 4, in which case, the flanges 66, 68 may be provided with inclined faces 66I, 68I to cooperate with such a clamping mechanism. The clamping mechanism shown in FIG. 4 comprises a generally C-shaped clamping ring that has opposed arms 70, 72 connected by a hinge portion 74. The arms 70, 72 define respective channels 76, 78 to receive the flanges 62, 64 and engage the inclined faces 66I, 68I. The free ends 80, 82 of the clamping ring are connected by a clamp bolt 84. A wing nut 86 may be fitted on the clamp bolt 84 to allow a user to selectively tighten the clamping ring onto the flanges 66, 68.

Although not essential, one or both of the second and fourth end portions 46, 56 may be provided with respective flanges 88, 90 and the respective end sections 20E, 22E of the exhaust line 20 and inlet line 22 may be provided with respective flanges (not shown) to allow coupling of the first and second coupling members 36, 38 to the exhaust pipe 20 and inlet 22 using securing units 92, 94, which may correspond to the securing unit 40.

The end section 20E has a lengthways extending axis 96 and the end section 22E has a lengthways extending axis 98. The axes 96, 98 are not aligned so that there is an offset 100 between them. As explained in more detail with reference to FIG. 5 below, by suitable relative rotation of the first and second coupling members 36, 38 prior to tightening of the securing units 40, 92, 94, a user can configure the vacuum system pipe coupling 24 so that the second lengthways extending axis 48 is aligned with the exhaust pipe end section axis 96, the fourth lengthways extending axis 58 is aligned with the inlet line end section axis 98 and the first lengthways extending axis 44 is aligned with the third lengthways extending axis 54 so that the first and second coupling members 36, 38 may be rigid and no flexible coupling member needs to be included in the vacuum system pipe coupling 24 to compensate for the offset 100.

Figure 5:
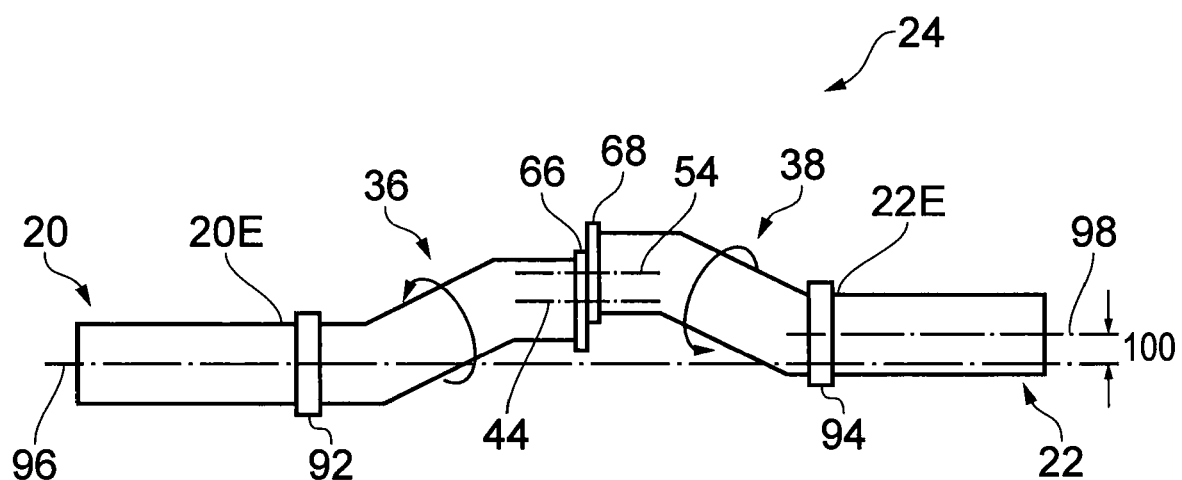
FIG. 5 is a view corresponding to FIG. 2 showing an assembly stage of the vacuum system pipe coupling of FIG. 2.

Referring to FIG. 5, the vacuum system pipe coupling 24 may be assembled by loosely connecting the first and second coupling members 36, 38 to the exhaust line end section 20E and inlet line end section 22E using the respective securing units 92, 94. At this stage, the first and second coupling members 36, 38 are still capable of rotation relative to the exhaust line end section 20E and inlet line end section 22E and rotation relative to one another. Due to the offset 100 between the respective end sections 20E, 22E of the exhaust line 20 and inlet line 22, the first and third lengthways extending axes 44, 54 and flanges 66, 68 may be out of alignment so that the flanges cannot be secured to one another by the securing unit 40. By suitable rotation of the first and second coupling members 36, 38 about the second and fourth lengthways extending axes 48, 58 (which are aligned with the pipe axes 96, 98), the first and third lengthways extending axes 44, 54 can be brought into alignment. At this stage, the flanges 66, 68 will be aligned in opposed face to face relation. The securing unit 40 may then be fitted around the flanges 66, 68 and, together with the securing units 92, 94, tightened to firmly secure the vacuum system pipe coupling between the exhaust line 20 and inlet line 22.

Figure 6:
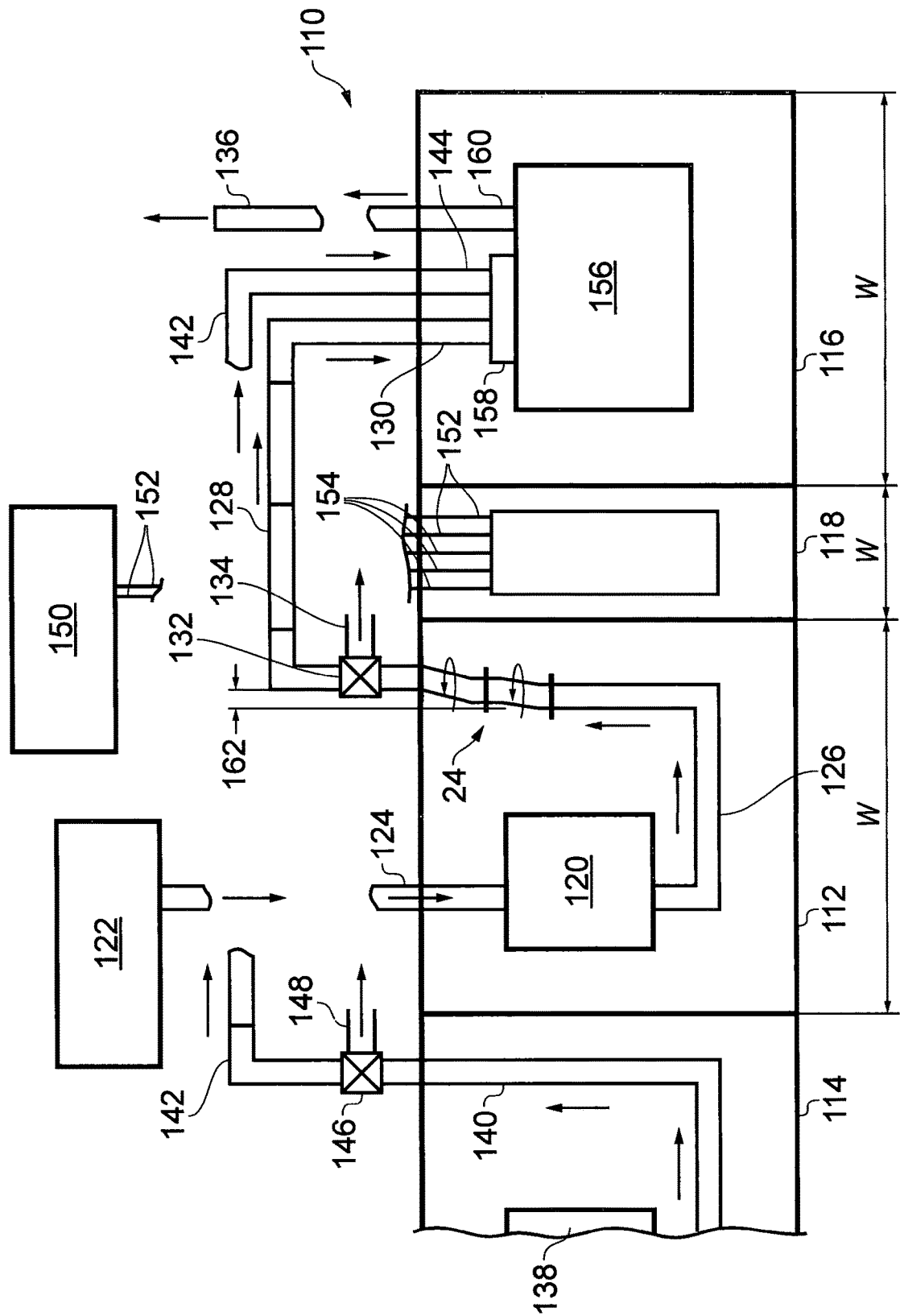
FIG. 6 is a schematic representation of another vacuum system that includes a vacuum system pipe coupling.

Referring to FIG. 6, the vacuum system pipe coupling 24 is shown in use in another vacuum system 110. The vacuum system 110 is a modular vacuum pumping system comprising a plurality of discrete functional modules disposed in side-by-side relation. Each functional module is functionally independent of the other functional module or modules in the system and may be connected with the adjoining functional module or modules on site to form the vacuum system 110. The vacuum system may comprise at least one functional module in the form of a pumping module and at least one functional module in the form of an abatement module. Alternatively, the vacuum system may comprise a plurality of pumping modules or a plurality of abatement modules. In addition to the functional modules, the vacuum system 110 may comprise a facilities module. In the example illustrated by FIG. 6, there are two pumping modules 112, 114, an abatement module 116 and a facilities module 118. The pumping module 112 comprises at least one pumping unit 120 and a module frame. The illustrated example is shown having one pumping unit 120, which is shown connected with processing apparatus 122 by an inlet line 124. An exhaust line 126 extends from the pumping unit to a connecting line 128 that channels gases that need to be cleaned into a first inlet line 130 of the abatement module 116. A diverter valve 132 may be provided in the connecting line 128 to allow gases flowing in the exhaust line 126 that do not need cleaning to be diverted into a bypass line 134 that leads to a discharge line 136, bypassing the abatement module 116. The or each pumping unit 120 may comprise one or more vacuum pumps and may, for example, comprise two vacuum pumps in series, for example a positive displacement pump to serve as a backing or roughing pump and a turbomolecular vacuum pump.

For ease of representation the pumping module 114 is only partially shown in FIG. 6. Like the pumping module 112, the pumping module 114 comprises at least one pumping unit 138 mounted in a module frame and the or each pumping unit comprises one or more vacuum pumps. The illustrated example is shown with one pumping unit 138. An exhaust line 140 extends from the pumping unit 138 to channel exhaust gases into a connecting line 142 that channels exhaust gases from the pumping unit 138 to a second inlet line 144 of the abatement module 116. The connecting line 142 may be provided with a diverter valve 146 to allow gases flowing in the exhaust line that do not need cleaning to be diverted into a bypass line 148 that leads to the discharge line 136, bypassing the abatement module 116. The pumping unit 138 may be connected with processing apparatus via an inlet line in similar fashion to the pumping unit 120. The processing apparatus may be the processing apparatus 122 or a different processing apparatus.

The facilities module 118 is configured to receive facilities from a source of facilities 150 via input lines 152 and distribute them to the pumping modules 112, 114 and abatement module 116 via output lines 154. The facilities module 118 may comprise one or more module controllers or a system master controller. The source of facilities 150 is a part of a customer's production infrastructure and are not a part of the vacuum system 110. Facilities are required to allow the pumping modules 112, 114 and abatement module 116 to operate correctly or to monitor or control operation of the vacuum system 110. For example, facilities may include clean dry air, nitrogen for purging, water for cooling, oxygen and methane or a plasma forming gas for abatement processes or low power (for example. 24V DC) for powering sensors or controllers.

The abatement module 116 comprises at least one abatement unit 156 which is configured to abate gas exhausted from the pumping modules 112, 114. The or each abatement unit may comprise a combustor or plasma burner, although any other suitable abatement component may be used. An abatement head 158 may be connected to the first and second inlet lines 130, 144 for conveying exhaust gases from the pumping units 120, 138 into the abatement unit 116. The abatement head 158 may comprise a plurality of gas inlets for conveying gas into a burner so that the gases can only mix in an environment which is at combustion temperatures (for example 1000° C.). This arrangement prevents upstream mixing of incompatible gases that may be exhausted from the pumping units 120, 138, for example where one exhaust gas includes a reducing agent and the other includes an oxidising agent. An exhaust line 160 channels the abated gas from the abatement unit 156 into the discharge line 136. If the vacuum system 110 is designed to operate in a processing environment in which gases exhausted by the pumping units 120, 138 are compatible, the abatement head 158 may comprise a manifold in which the gases mix prior to entering the abatement unit 156.

In this example, the vacuum system pipe coupling 24 is shown compensating for an offset 162 between the exhaust line 126 and the connecting line 128. It will, however, be understood, that instead of being used in an upright pipe run as shown in FIG. 6, the vacuum system pipe coupling 24 could be used in a horizontally extending pipe run. Thus, the vacuum system pipe coupling 24 could be used to compensate for an offset in one of the connecting lines 128, 142. It will also be understood that multiple vacuum system pipe couplings 24 may be used in a vacuum system such as the vacuum system 110 when there are multiple pipe runs that include non-aligned pipe sections or pipe sections and unit inlet or outlet ports that are not aligned.

In at least some examples, each functional module has a width W that is a multiple of an integer value X. At least in the widthways direction, the functional unit (pumping unit, or units, in a pumping module and abatement unit, or units, in an abatement module) will be the largest component of a functional module. The width W of a functional module is determined by the width of the functional unit or unit (largest component or components), any component requiring accessibility and the module frame. The vacuum system width is capable of being readily determined once all of the functional requirements of the system are known as all functional modules are made to the smallest footprint possible, while being a multiple of the largest integer value X that will suit all modules. To this end the integer value X would not be very small, for example 1 mm, as this would not be the largest integer that is divisible into all module widths. Using the largest integer value X allows the smallest number of steps for functional units and components requiring accessibility where width may be critical to their continuity or connectivity across a vacuum system. A modular vacuum system may additionally comprise a facilities module as shown in FIG. 6. The facilities module also has a width that is a multiple of the integer value X. The facilities module may be installed ahead of the functional modules to provide a datum for the vacuum system and allow the installation of external lines, such as the connecting lines 128, 142 and facilities lines 152 shown in FIG. 6 where the external lines are not custom made and fitted following installation of the vacuum system, while the functional modules are being manufactured and tested. It will be understood that in modular vacuum systems as illustrated by FIG. 6, there may be greater need for a means to compensate for non-alignment of pipe sections, particularly as in some cases the pipe runs may be long with the potential for a tolerance stack up.

Figure 7:
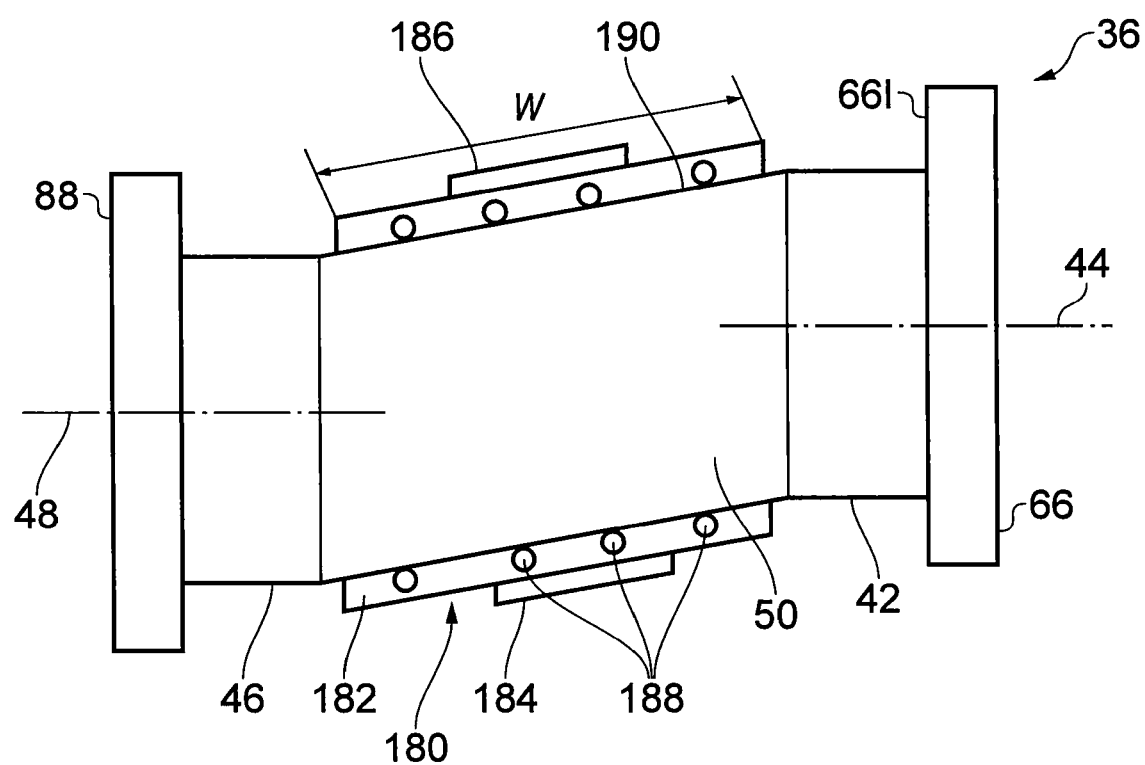
FIG. 7 is a schematic representation of pipe member of the vacuum system pipe coupling of FIG. 2 fitted with a pipe heater.

FIG. 7 shows a coupling member 36 of the vacuum system pipe coupling 24 fitted with a pipe heater 180. The pipe heater 180 comprises a strip of flexible substrate 182 provided with straps 184 and buckling 186. The flexible substrate 182 can be wrapped around a pipe in the manner of a cuff and secured in place by using the straps 184 and buckling 186. The pipe heater 180 further comprises heating elements 188 that may be housed within the flexible substrate 182 or disposed on the inner face 190 of the substrate. The heating elements 188 may be electrical resistance heating elements. The inner face 190 of the flexible substrate 182 is able to engage the pipe member 36 across at least substantially all of its width. In some examples, there may be at least substantially full surface contact between the inner face 190 of the flexible substrate 182. Accordingly, by choosing a suitably sized pipe heater 180, it is possible, for example, to provide at least substantially uniform heating of the connecting portion 50 along at least substantially its entire length thereby reducing or avoiding the risk of there being cold spots on which gases flowing through the pipe member 36 may condense. It will be understood that a suitably sized pipe heater may cover the end portions 42, 46 of the coupling member such that substantially the entire surface of the coupling member between the flanges is engaged and heated by the pipe heater. It is to be understood that this advantage is not limited to the particular form of pipe heater shown in FIG. 7 and that in principle being able to mount any suitable known pipe heater on a generally smooth cylindrical surface as shown, as opposed to the corrugated surface of a bellows, should result in even heating of the pipe member with at least a reduced likelihood of there being cold spots.

The pipe members of the first and second pipe coupling members may be made of three pipe sections welded end to send with respective flanges welded onto the opposed ends of the pipe members. Conveniently, in other examples, the offset in the pipe member may be produced by CNC bending of a pipe and the flanges then welded to the ends of the formed pipe. The skilled person will understand that these are but two examples of the numerous ways in which a coupling member such as the coupling members 36, 38 may be manufactured and it is to be understood that the examples given are not to be taken as limiting.

The first and second coupling members may be made of any suitable metal. The choice of metal may be determined by the properties of the gases that will flow through the vacuum system pipe coupling when in use. In many examples, the first and second coupling members will be made of a suitable stainless steel.

It will be understood that when the vacuum system pipe coupling is secured in position in a vacuum system, it is not deformed or stressed such as to provide the potential for damage to the coupling. Furthermore, adjustment of the vacuum system pipe coupling to compensate for non-alignment of two pipe sections does not require the application of substantial forces to the coupling to deform it. Instead, it is simply necessary to cause relative rotation of the first and second coupling members to bring the lengthways extending axes of the innermost portions of the coupling members (the first and third lengthways extending axes 44, 54 in FIG. 3) into alignment prior to securing the pipe members in position using the securing unit. Additionally, since the coupling members do not have to be deformed, the flanges of the vacuum system pipe coupling will not be twisted, or tilt, with respect to the flanges on the pipe sections the vacuum system pipe coupling is connecting. Accordingly, the likelihood of leaks forming is reduced. Still further, since the coupling members do not have to be deformed, installation is easier than with a bellows since the installer does not have to maintain deforming force on the coupling members while tightening the securing units.

A further advantage provided by a vacuum system pipe coupling comprising first and second coupling members having offset end portions as illustrated, by way of example, in FIGS. 2 and 3 is that there is the potential to design couplings that are able to compensate for a considerably greater degree of non-alignment of the pipe sections being connected than is possible with a bellows. With reference to FIG. 3, it will be understood that by increasing the respective lateral offsets between the lengthways extending axes 44, 54 and the lengthways extending axes 48, 58, a greater radial sweep is produced by the rotation of the coupling members allowing compensation for a correspondingly greater lateral offset between pipe sections that are connected by the vacuum system pipe coupling. In principle, vacuum system pipe couplings capable of compensating pipe offsets of tens of millimetres are readily achievable.

In the illustrated examples, the vacuum system pipe coupling is shown comprising two identical coupling members. This is not essential. For some applications, it may be desirable to make one of the coupling members longer than the other to avoid having to build up pipe systems from a larger number of pipe sections with a correspondingly larger number of joints. Thus, one of the coupling members may comprise a length of piping sufficient to provide a required pipe run.

Examples of the vacuum system pipe coupling as described and illustrated herein provide two rigid coupling members having respective outer end portions that are releasably securable to the respective ends of two pipe sections that are to be connected and respective inner end portions that are laterally offset with respect to the outer end portions so that relative rotation of the outer end portions about their respective lengthways extending axes causes the lengthways extending axes of the inner end portions to describe an arc. By suitable relative rotation of the coupling members the lengthways extending axes of the inner end portions can be brought into alignment prior to fixing the inner end portions in position by a securing unit such as a ring clamp mechanism. The respective ends of the inner and outer end portions of the coupling members may be defined by flanges and the coupling members fitted between respective flanges provided at the respective ends of the pipe sections that are connected using the vacuum system pipe coupling. In examples in which each of the flanges of the coupling members and the flanges of the pipe sections have the same configuration, it is possible to use the same type of securing unit at all three connection positions.

In this specification, reference is made to the vacuum system pipe coupling connection two end sections of a pipeline such as an inlet line, exhaust line or connecting line. It is to be understood that in context one of the two end sections may be defined by an inlet or exhaust port of a piece of equipment such as a pumping or abatement unit.

The invention claimed is:

1. A vacuum system pipe coupling comprising:
a first coupling member defining a through passage;
a second coupling member defining a through passage; and
a securing unit,
wherein the first and second coupling members are made of metal,
wherein the first coupling member has a first end portion having a first lengthways extending axis, a second end portion having a second lengthways extending axis that is laterally offset with respect to the first lengthways extending axis and a first connecting portion connecting the first end portion with the second end portion,
wherein the second coupling member has a third end portion having a third lengthways extending axis, a fourth end portion having a fourth lengthways extending axis that is laterally offset with respect to the third lengthways extending axis and a second connecting portion connecting the third end portion with the fourth end portion,
wherein the securing unit is configured to secure said first end portion to the third end portion with the first and third lengthways extending axes in alignment
wherein the first and second coupling members comprise respective pipe members, and
wherein the pipe member of the first coupling member at least partially defines said the first and second end portions and said the first connecting portion and the pipe member of the second coupling member at least partially defines said the third and fourth end portions and said the second connecting portion,
the vacuum system pipe coupling further comprising a pipe heater, wherein the pipe heater comprises a flexible substrate having an inner face and, in use, is wrapped around the pipe member of the first coupling member forming a cuff around the pipe member of the first coupling member, wherein said the inner face engages said the pipe member and in at least one of a lengthways and a widthways direction of said the inner face there is no discontinuity in the engagement between the inner face and first coupling member.

2. A vacuum system pipe coupling as claimed in claim 1, wherein said first end portion comprises a first flange and said third end portion comprises a third flange and the securing unit is configured to secure the first end portion to the third end portion by securing first flange to the third flange in face to face relation.

3. A vacuum system pipe coupling as claimed in claim 1, wherein the first connecting portion has a fifth lengthways extending axis and the fifth lengthways extending axis extends transverse to the first and second lengthways extending axes.

4. The vacuum system pipe coupling as claimed in claim 1, wherein the second connecting portion has a sixth lengthways extending axis and the sixth lengthways extending axis extends transverse to the third and fourth lengthways extending axes.

5. The vacuum system pipe coupling as claimed in claim 1, wherein at least one of:
   i) the first lengthways extending axis and the second lengthways extending axis are parallel axes; and
   ii) the third lengthways extending axis and the fourth lengthways extending axis are parallel axes.

6. The vacuum system pipe coupling as claimed in claim 1, wherein the pipe members have a substantially constant diameter.

7. The vacuum system pipe coupling as claimed in claim 1, wherein the first and second coupling members are rigid bodies.

8. A vacuum system comprising:
   a pumping unit having an inlet and an outlet; and
   a pipeline coupled to one of said inlet and said outlet,
   wherein the pipeline comprises a first pipe having a lengthways extending axis and a second pipe having a lengthways extending axis that is laterally offset with respect to the lengthways extending axis of the first pipe, and
   wherein the first pipe is coupled to the second pipe by a vacuum system pipe coupling as claimed in claim 1, arranged such that the first and third lengthways extending axes are in alignment.

9. A vacuum system comprising:
   an abatement unit having an inlet and an outlet and a pipeline coupled to one of the inlet and the outlet,
   wherein said pipe line comprises a first pipe having a lengthways extending axis and a second pipe having a lengthways extending axis that is laterally offset with respect to the lengthways extending axis of the first pipe, and
   wherein the first pipe is coupled to the second pipe by a vacuum system pipe coupling as claimed in claim 1, arranged such that the first and third lengthways extending axes are in alignment.

* * * * *